United States Patent
Gomi

(10) Patent No.: US 6,368,412 B1
(45) Date of Patent: Apr. 9, 2002

(54) APPARATUS WITH HIGH TEMPERATURE GAS RELEASING MEANS FOR VAPOR DEPOSITION OF PARYLENE POLYMER WITHOUT PEELING

(75) Inventor: Hideki Gomi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/605,891

(22) Filed: Jun. 29, 2000

Related U.S. Application Data

(62) Division of application No. 09/192,534, filed on Nov. 17, 1998, now Pat. No. 6,130,171.

(30) Foreign Application Priority Data

Nov. 18, 1997 (JP) ............................................. 9-317499

(51) Int. Cl.⁷ ............................................. C23C 16/00
(52) U.S. Cl. ...................................................... 118/725
(58) Field of Search ............................... 118/715, 719, 118/722, 724, 725, 75, 506; 427/248.1, 255.23, 255.28, 255.6, 255.7, 255.395, 294, 314, 316, 331, 350, 372.2, 374.2, 384, 401

(56) References Cited

U.S. PATENT DOCUMENTS

| | | | | |
|---|---|---|---|---|
| 5,538,758 A | * | 7/1996 | Beach et al. |
| 5,556,473 A | * | 9/1996 | Olsdn et al. |
| 5,641,358 A | * | 6/1997 | Stewart |
| 5,709,753 A | * | 1/1998 | Olson et al. |
| 5,882,725 A | * | 3/1999 | Radford |
| 5,958,510 A | * | 9/1999 | Sivaramakrishnam et al. |
| 6,086,679 A | * | 7/2000 | Lee et al. |
| 6,123,993 A | * | 9/2000 | Xu et al. |

FOREIGN PATENT DOCUMENTS

| | | | |
|---|---|---|---|
| JP | 6-112336 | | 4/1994 |
| JP | 10-189569 | | 4/1996 |
| JP | 09-326388 A | * | 12/1997 |
| JP | 10-113610 | | 5/1998 |

OTHER PUBLICATIONS

N. Majid et al., "Experimental Study of Parylene As Inter-layer Dielectrics for Wafer Scale Interconnections", VLSI Multilevel Interconnection Conference Proceedings, Jun. 13–14, 1988, pp. 299–305.

* cited by examiner

Primary Examiner—Keith Christianson
Assistant Examiner—Evan Pert
(74) Attorney, Agent, or Firm—Sughrue Mion, PLLC

(57) ABSTRACT

Polymer of parylene is desirable for an inter-level insulating layer because of a small dielectric constant; however, dimer/monomer of parylene is taken into a polymer layer during the deposition, residual dimer/monomer produces outgas during deposition of silicon oxide over the polymer layer, and the silicon oxide layer tends to peel off from the polymer layer; in order to prevent the resultant semiconductor structure layer from peeling of the silicon oxide layer, the polymer layer is annealed before the deposition of the silicon oxide for previously releasing the residual dimer/monomer from the polymer layer.

9 Claims, 8 Drawing Sheets

APPARATUS WITH HIGH TEMPERATURE GAS RELEASING MEANS FOR VAPOR DEPOSITION OF PARYLENE POLYMER WITHOUT PEELING

This is a divisional of application Ser. No. 09/192,534 now U.S. Pat. No. 6,130,171 filed Nov. 17, 1998.

FIELD OF THE INVENTION

This invention relates to a fabrication technology for a semiconductor device and, more particularly, to a process for fabricating a semiconductor integrated circuit device having an inter-level insulating layer of parylene polymer and a deposition system used therein.

DESCRIPTION OF THE RELATED ART

Manufacturers have increased circuit components of an integrated circuit device, and, accordingly, scaled down the circuit components and conductive strips used as signal lines. The conductive strips are arranged at extremely narrow intervals on an insulating layer, and are covered with another insulating layer. Two adjacent conductive strips and the insulating layer therebetween form a parasitic capacitor, and the parasitic capacitor retards signal propagation along the conductive strips. The parasitic capacitance is increased inversely proportional to the gaps between the conductive strips, and the signal delay becomes serious.

The parasitic capacitance is proportional to the dielectric constant of the insulating layer. Even though the conductive strips are arranged at the extremely narrow intervals, a kind of insulating material with a small dielectric constant does not increase the parasitic capacitance.

Parylene is attractive material, and an inter-level dielectric layer of parylene is disclosed by N. Majid et. al. in "Experimental Study of Parylene As Interlayer Dielectrics for Wafer Scale Interconnections", 1988 VLSI Multilevel Interconnection Conference Proceedings, pages 299 to 305, Jun. 13–14, 1988. Parylene is poly(para-xylylene). FIG. 1 illustrates the prior art deposition system for an insulating layer of parylene. The prior art deposition system includes a vaporizer 1, a pyrolysis unit 2, a deposition unit 3 and pipes 4a/4b connected between the vaporizer 1, the pyrolysis unit 2 and the deposition unit 3. A dimer of parylene is sublimated in the vaporizer 1 at 250 degrees in centigrade at 1 torr, and the dimer of parylene gas flows through the pipe 4a into the pyrolysis unit 2. The pyrolysis unit 2 is. maintained at 680 degrees in centigrade at 0.5 torr, and the dimer gas of parylene is cracked in the pyrolysis unit 2. Monomer gas of parylene is produced from the dimer gas of parylene, and is supplied from the pyrolysis unit 2 to the deposition unit 3. A semiconductor wafer 5 is accommodated in the deposition unit 3, and the deposition chamber is maintained at 0.1 torr. The surface of the semiconductor wafer 5 is near 25 degrees in centigrade, and the monomer of parylene is polymerized on the surface of the semiconductor wafer 5. As a result, a polymer layer of parylene is formed.

Using the polymer layer of parylene as an inter-level insulating layer, a multi-layered wiring structure is fabricated as shown in FIGS. 2A to 2E. Firstly, a semiconductor wafer 11 is prepared. Though not shown in the figures, the major surface of the semiconductor wafer 11 is covered with an insulting layer. Aluminum is deposited over the major surface of the semiconductor wafer 11, and the aluminum layer is patterned into lower conductive strips 12a/12b by using a photo-lithography and an etching as shown in FIG. 2A.

The lower conductive strips 12a/12b are covered with a polymer of parylene through the prior art deposition system shown in FIG. 1, and the polymer layer 13 of parylene conformably extends over the lower conductive strips 12a/12b as shown in FIG. 2B. Silicon oxide is deposited over the polymer layer of parylene 13 by using a chemical vapor deposition, and the silicon oxide layer is chemically mechanically polished, and a smooth surface of the silicon oxide layer 14 is created as shown in FIG. 2C. The polymer layer 13 of parylene and the silicon oxide layer 14 form in combination an inter-level insulating structure 15.

Contact-holes 15a/15b are formed in the inter-level insulating structure 15 by using the photo-lithography and an etching, and the lower conductive strips 12a/12b are exposed to the contact-holes 15a/15b. The contact holes 15a/15b are plugged with tungsten pieces 16a/16b, respectively as shown in FIG. 2D, and an upper conductive strip 17 of aluminum is patterned on the inter-level insulating structure 15 by using the deposition, the photo-lithography and the etching. The upper conductive strip 17 is electrically connected through the tungsten plugs 16a/16b to the lower conductive strips 12a/12b as shown in FIG. 2E.

The manufacturer encounters a problem in the prior art process in that the silicon oxide layer 14 peels from the polymer layer 13 of parylene. The peeling is derived from residual monomer of parylene and residual dimer of parylene in the polymer layer 13. All the dimer gas is not decomposed into monomer gas, and the residual dimer gas is carried into the deposition chamber together with the monomer gas. Moreover, the monomer is not only polymerized in the deposition chamber but also recombined into the dimer of parylene. For this reason, the dimer and the monomer are taken into the polymer layer 13 during the polymerization, and cause peeling. The residual dimers and the residual monomers are vaporized around 400 degrees centigrade during the deposition of silicon oxide layer 14 and the deposition of tungsten, and the dimer gas and the monomer gas cause the silicon oxide layer 14 to peel from the polymer layer 13 of parylene.

SUMMARY OF THE INVENTION

It is therefore an important object of the present invention to provide a process for fabricating a semiconductor device, which has a polymer layer of parylene strongly adhered to another layer.

It is also an important object of the present invention to provide a deposition system, which is used for growth of the polymer layer of parylene.

To accomplish the object, the present invention proposes to release the residual dimer/monomer gas from a polymer layer of parylene before deposition of another material over the polymer layer.

In accordance with one aspect of the present invention, there is provided a process for fabricating a semiconductor device comprising the steps of preparing a semiconductor structure having a first layer, supplying a source gas over the first layer so as to form a polymer mainly consisting of parylene over the first layer, releasing residue of the source gas from the polymer mainly consisting of parylene in a high temperature vacuum, a high temperature inert gas containing atmosphere or a high temperature nitrogen containing atmosphere and covering the polymer mainly consisting of parylene with a second layer.

In accordance with another aspect of the present invention, there is provided a vapor phase deposition system for forming a polymer layer mainly consisting of parylene on a semiconductor structure comprising a reactor having a reaction chamber where the semiconductor structure is accommodated, an evacuating sub-system connected to the reactor for creating vacuum in the reaction chamber, a gas supply sub-system connected to the reactor and supplying a source gas to the reaction chamber for forming a polymer layer mainly consisting of parylene over the semiconductor structure and a gas releasing means for releasing residue of the source gas from the polymer layer mainly consisting of parylene in a high temperature vacuum, a high temperature inert gas containing atmosphere or a high temperature nitrogen containing atmosphere.

BRIEF DESCRIPTION OF THE DRAWINGS

The features and advantages of the process and the deposition system will be more clearly understood from the following description taken in conjunction with the accompanying drawings in which.

DESCRIPTION OF THE PREFERRED EMBODIMENTS

First Embodiment

FIGS. 3A to 3F illustrate a process for fabricating a semiconductor device embodying the present invention. The process starts with preparation of a semiconductor structure 21. In this instance, transistors (not shown) are fabricated on a silicon substrate 21a, and are covered with a lower insulating layer 21b.

Figure 1:
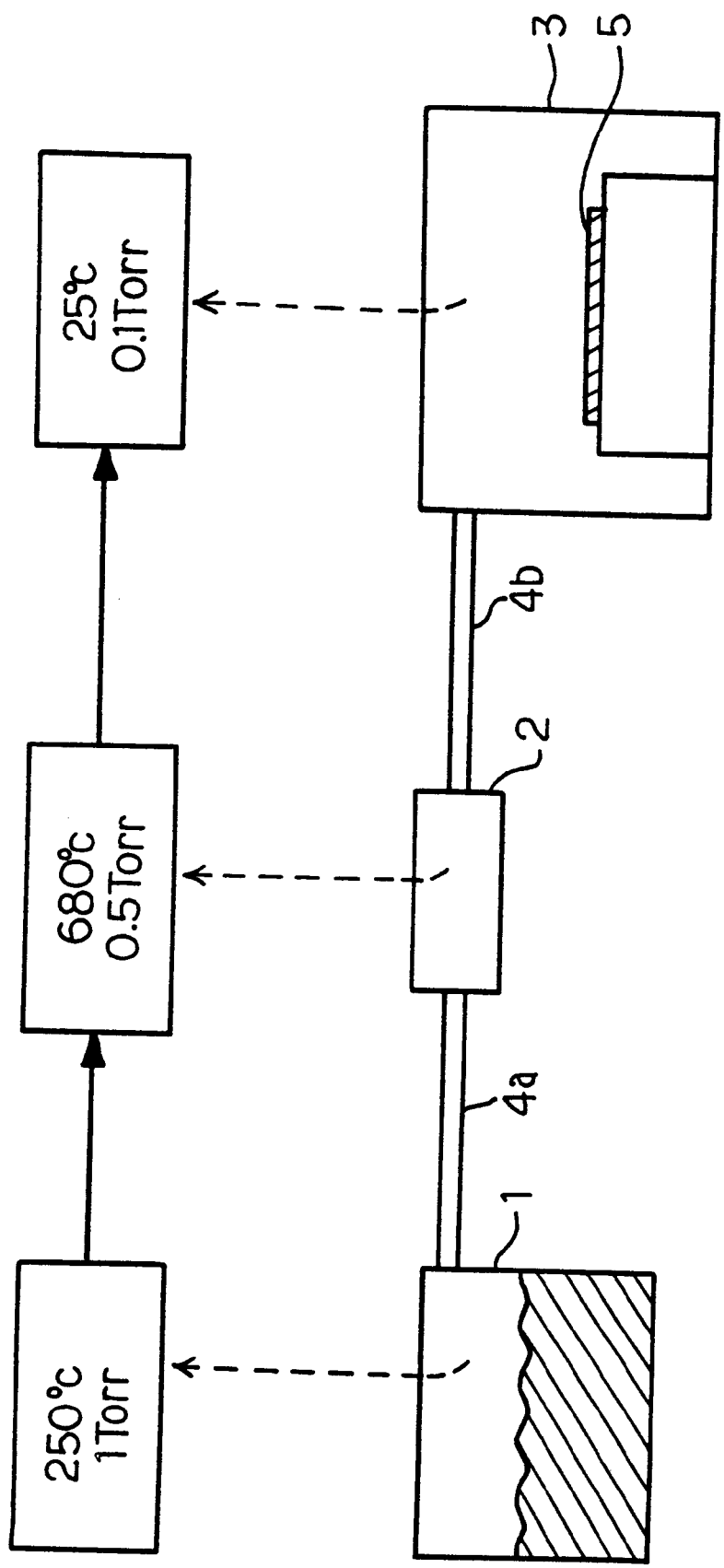
FIG. 1 is a schematic view showing the prior art deposition system disclosed in the paper.
Figure 2A:
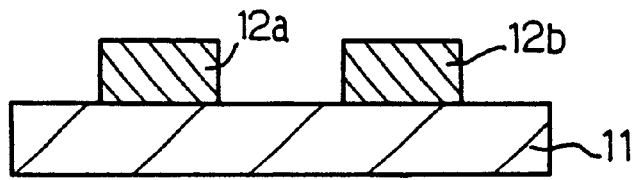
FIGS. 2A to 2E are cross sectional views showing the prior art process for fabricating a multi-layered wiring structure.
Figure 2B:
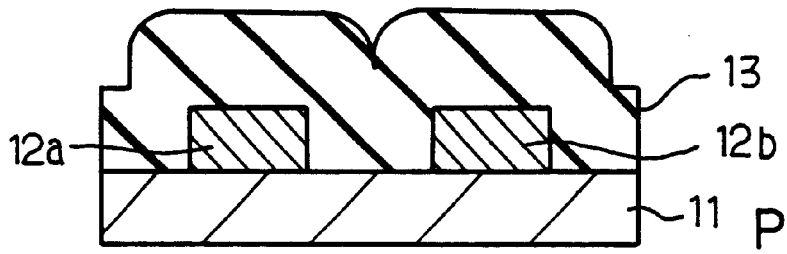
Figure 2C:
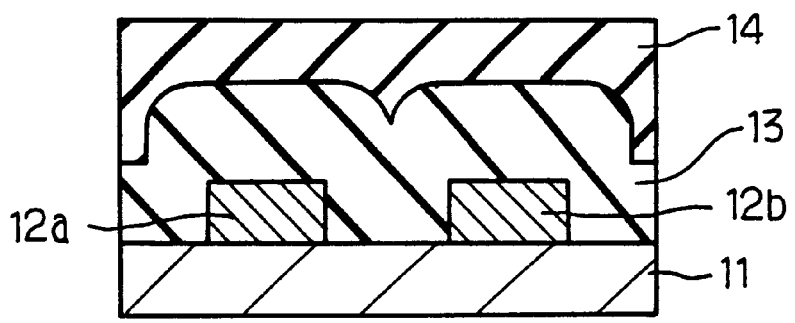
Figure 2D:
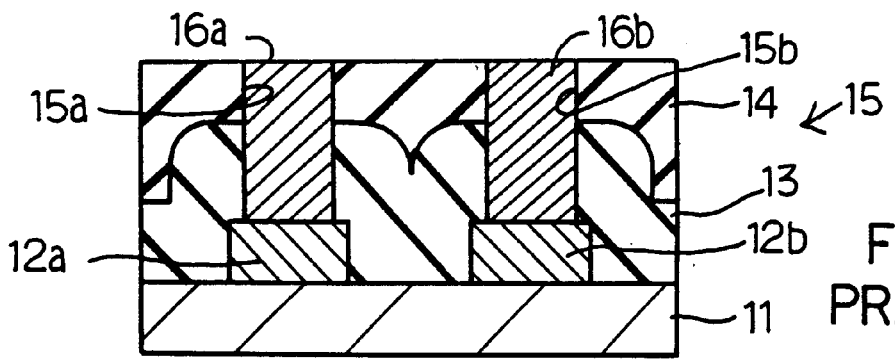
Figure 2E:
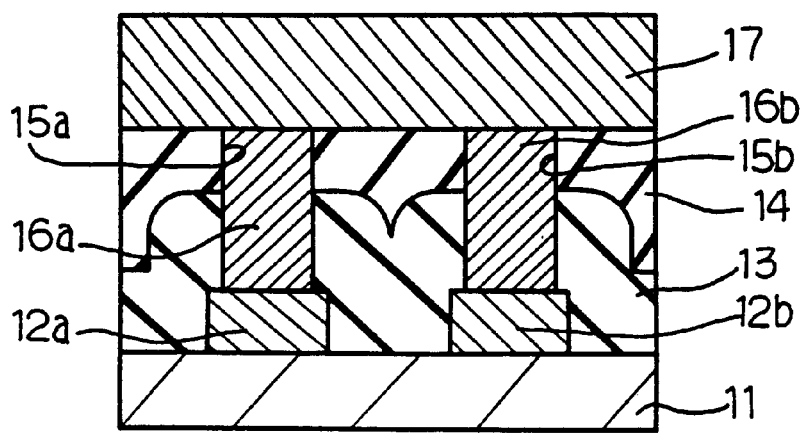
Figure 3A:
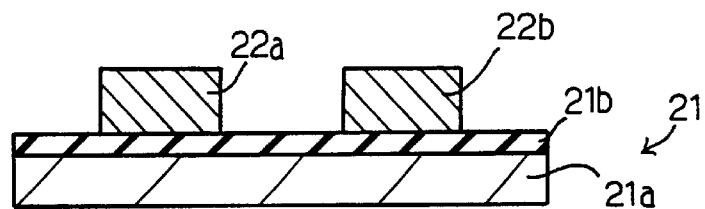
FIGS. 3A to 3F are cross sectional views showing a process for fabricating a semiconductor device according to the present invention.

Aluminum or aluminum alloy is deposited over the entire surface of the lower insulating layer 21b, and photo-resist solution is spread over the aluminum/aluminum alloy layer. The photo-resist solution is baked, and a latent image for conductive wiring strips is transferred from a photo mask (not shown) to the photo-resist layer so as to form a latent image. The latent image is developed, and the photo-resist layer is formed into a photo-resist etching mask (not shown). Using the photo-resist etching mask, the aluminum/aluminum alloy layer is selectively removed so as to pattern the aluminum/aluminum alloy layer into lower conductive wiring strips 22a/22b as shown in FIG. 3A. The conductive wiring strips 22a/22b are selectively connected to the transistors.

Figure 4:
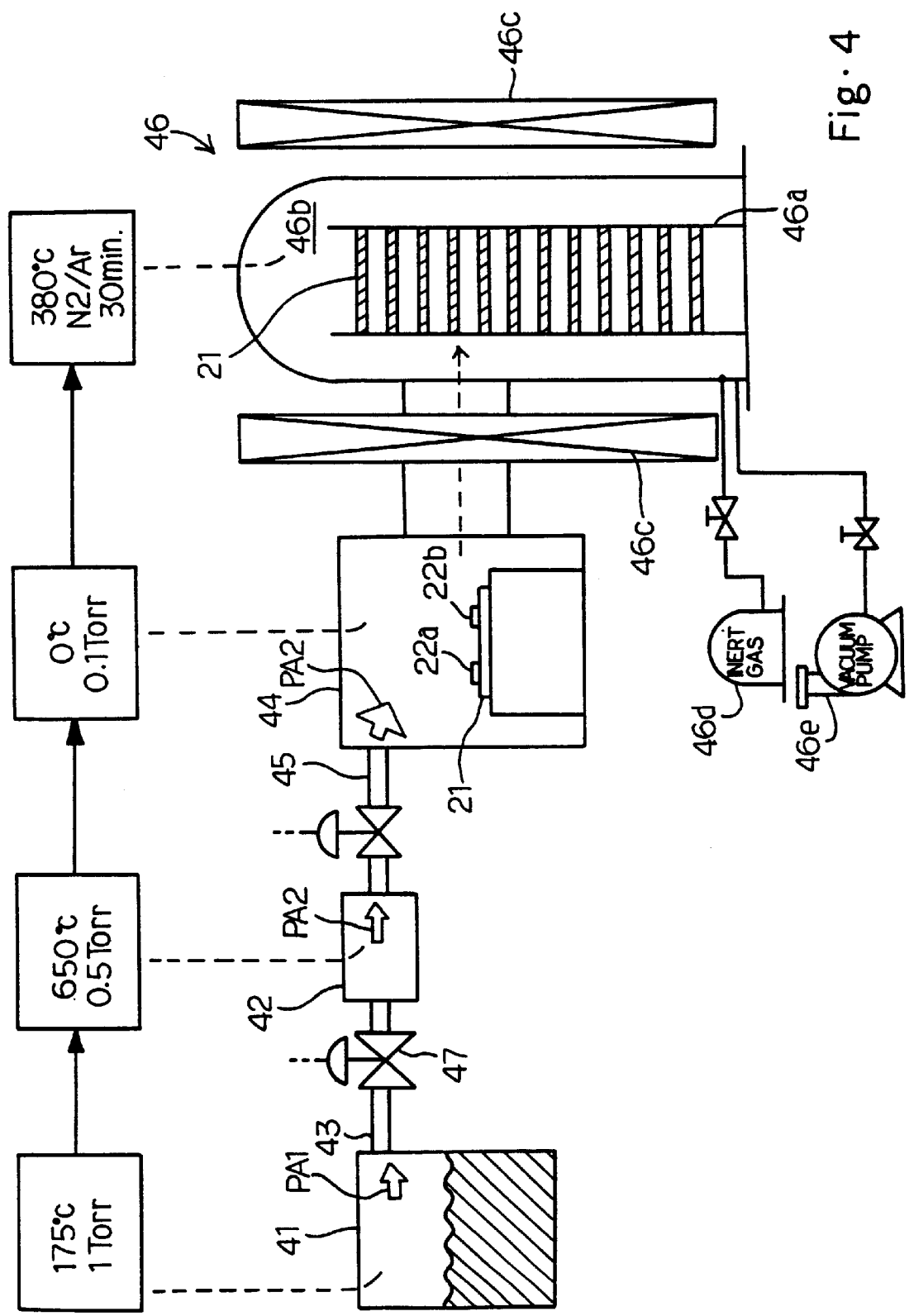
FIG. 4 is a schematic view showing a vapor phase deposition system

Subsequently, polymer of parylene-N is grown on the resultant structure shown in FIG. 3A. A vapor phase deposition system is shown in FIG. 4. The vapor phase polymer growing system comprises a vaporizer 41, a pyrolizer 42 connected through a pipe 43 to the vaporizer 41, a deposition reactor 44 connected through a pipe 45 to the pyrolizer 42 and a furnace 46. A diffusion furnace may be used as the furnace 46. A quartz boat 46a is placed in the furnace chamber 46b, and a heater 46c is provided for the furnace chamber 46b. An inert gas supply system 46d and a vacuum pump 46e are connected to the furnace chamber 46b, and create vacuum or inert gas atmosphere in the furnace chamber 46b. The inert gas supply system 46d may create nitrogen atmosphere or inert gas/nitrogen containing atmosphere, i.e., gaseous mixture between inert gas and nitrogen gas and gaseous mixture between more than one kind of inert gas. The nitrogen atmosphere and the gaseous mixture between the nitrogen and the inert gas are categorized in nitrogen containing atmosphere, and the inert gas atmosphere, the gaseous mixture between the nitrogen and the inert gas and gaseous mixture between more than one kind of inert gas are categorized in inert gas containing atmosphere.

Solid-phase dimer of parylene-N or di-para-xylylene is stored in the vaporizer 41, and is sublimated so as to generate dimer gas at 175 degrees in centigrade at 1 torr. The pyrolizer 42 is maintained at 650 degrees in centigrade, and the pressure is regulated to 0.5 torr. The dimer gas flows through the pipe 43 into the pyrolizer 42, and a flow control valve 47 controls the flow rate of the dimer gas PA1. In the pyrolizer 44, the dimer gas PA1 is decomposed into monomer gas PA2 of parylene-N. The deposition reactor 44 is regulated to 0.1 torr, and the resultant structure shown in FIG. 3A is placed in the deposition reactor 44. The surface of the resultant structure is maintained at 0 degrees in centigrade. The monomer gas PA2 is introduced into the deposition reactor 44, and is polymerized. The polymer of parylene-N is grown on the resultant structure at 5000 angstroms per minute, and the lower conductive wiring strips 22a/22b are covered with the polymer layer 23 as shown in FIG. 3B.

Figure 3B:
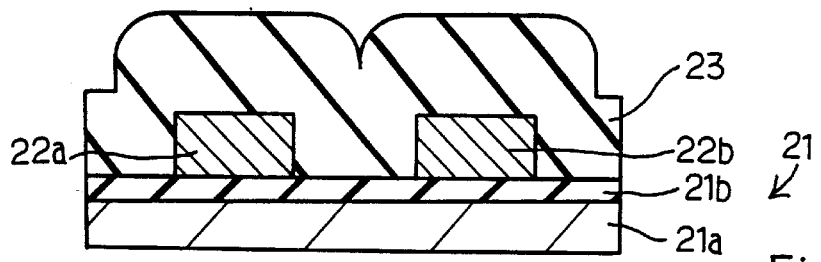

When the polymer layer 23 is grown to a predetermined thickness, the resultant structure shown in FIG. 3B is warmed to room temperature in vacuum, and, thereafter, the reaction chamber is recovered to the atmospheric pressure through a load lock (not shown).

Subsequently, the resultant structure shown in FIG. 3B is placed on the quartz boat 46a, and the quartz boat 46a is transferred to the furnace chamber 46b without exposing the atmosphere. In order to prevent the resultant structure shown in FIG. 3B from the atmosphere, inert gaseous mixture is blown to the quartz boat 46a at 40 litters per minute. In this instance, the inert gaseous mixture consists of nitrogen and argon, and the nitrogen gas and the argon gas are regulated to 1:1.

When the quartz boat 46a is placed in the furnace chamber, the furnace chamber is heated to 380 degrees in centigrade, and the polymer layer 23 is annealed for 30 minutes. While the polymer layer 23 is being annealed, the gaseous mixture between the nitrogen and the argon is continuously blown to the quartz boat 46a at the flow rate, and residual dimer/monomer of parylene-N PA3 are released from the polymer layer 23 as shown in FIG. 3C.

Figure 3C:
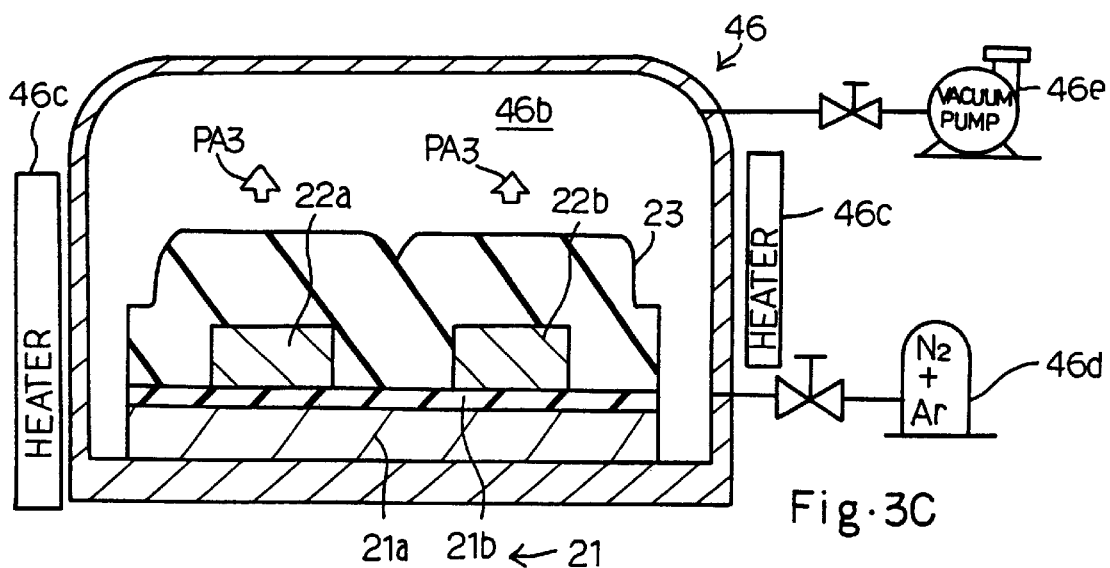
Figure 3D:
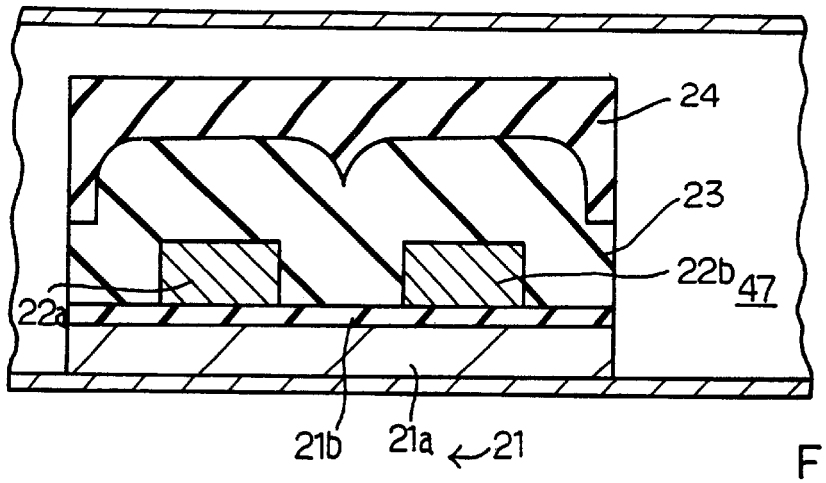

The resultant structure shown in FIG. 3C is transferred from the furnace chamber 46b to a deposition chamber 47 of a plasma-assisted chemical vapor deposition system, and silicon oxide is deposited over the polymer layer 23 at 380 degrees in centigrade through a plasma-assisted chemical vapor deposition. The silicon oxide forms a silicon oxide layer 24, and is chemically mechanically polished so as to create a flat surface as shown in FIG. 3D.

The polymer layer 23 of parylene-N and the silicon oxide layer 24 form in combination an inter-level insulating structure 25. The parylene-N has a dielectric constant of 2.8, and the inter-level insulating structure 25 is expected to reduce a parasitic capacitance between the lower conductive writing strips 22a/22b and an upper conductive wiring strip described hereinlater.

A photo-resist etching mask (not shown) is formed on the silicon oxide layer 24, and the silicon oxide layer 24 and the polymer layer 23 are selectively etched away so as to form contact holes 26a/26b. The lower conductive wiring strips 22a/22b are exposed to the contact holes 26a/26b, respectively.

Figure 3E:
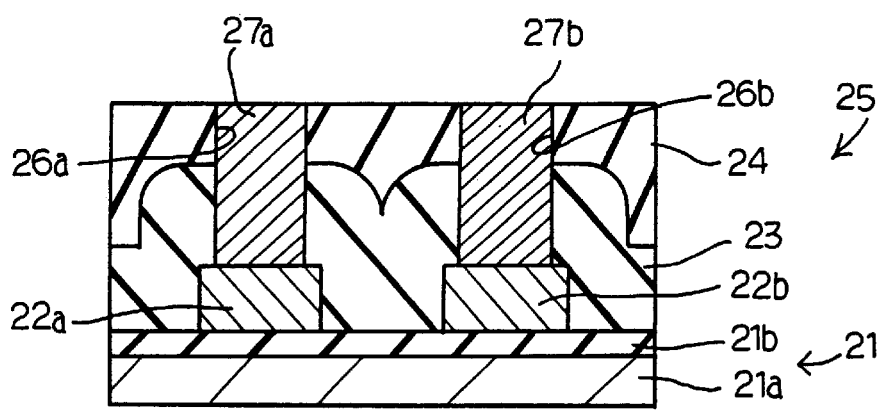
Figure 3F:
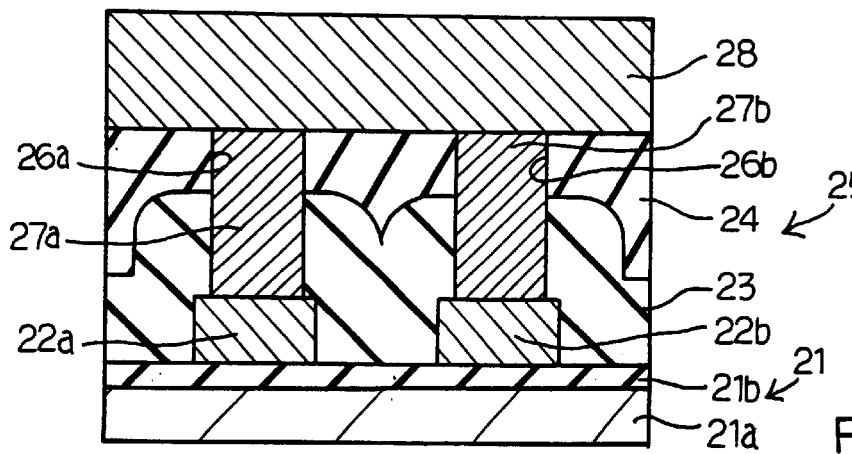

The contact holes 26a/26b are plugged with tungsten pieces 27a/27b, respectively, as shown in FIG. 3E, and an aluminum/ aluminum alloy wiring strip 28 is patterned on the silicon oxide layer 24 as similar to the lower conductive wiring strips 22a/22b as shown in FIG. 3F.

In the first embodiment, the vacuum pump 46e serves as an evacuating sub-system, and the vaporizer 41, the pyrolizer 42, the pipes 43/45 and the control valve 47 as a whole constitute a gas supply sub-system. The furnace 46 serves as a gas releasing means.

As will be understood from the foregoing description, the residual dimer/monomer are released from the polymer layer 23 before deposition of silicon oxide, and the silicon oxide layer 24 does not peel from the polymer layer 23. Moreover, the polymer layer 23 per se increases the adhesion to the lower insulating layer 21b. Thus, the manufacturer improves the reliability of the inter-level insulating structure 25 over the polymer layer 24 through the release of the residual gas, and effectively reduces the parasitic capacitance between the lower conductive wiring strips 22a/22b and the upper conductive wiring strip 28.

Moreover, the polymer layer 23 is never exposed to the wet atmosphere between the completion of the polymerization and the deposition of the silicon oxide. The vacuum or the inert gas atmosphere prevents the polymer layer 23 from water vapor contained in the atmosphere, and water is hardly taken into the polymer layer 23. The water increases the dielectric constant of the polymer of parylene. However, the polymer layer 23 does not contain water, and has a small dielectric constant.

Figure 5:
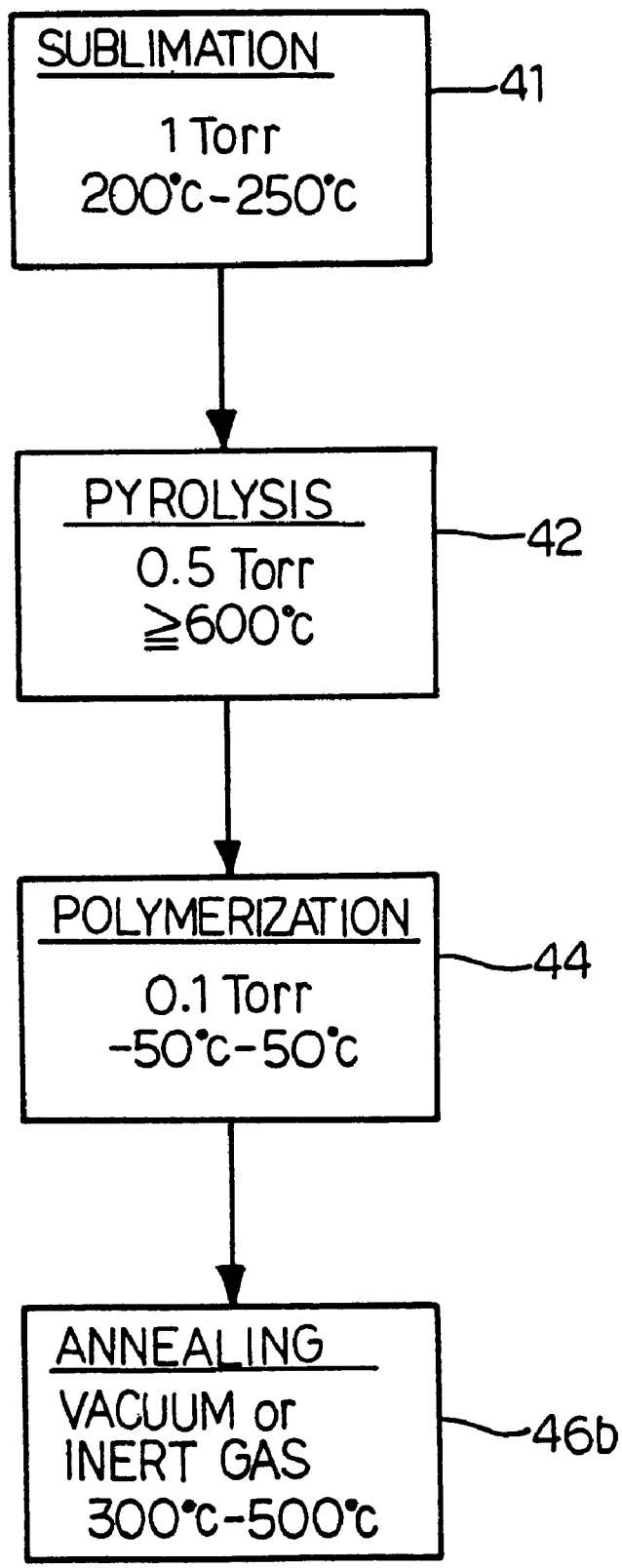
FIG. 5 is a flow chart showing conditions for growing a polymer layer of parylene according to the present invention.

The dimer/monomer/polymer are never limited to parylene-N. Parylene-C, parylene-D, parylene-F or organic insulating compound mainly composed of parylene are available for the inter-level insulating layer 23. For this reason, the temperature in the vaporizer 41, pyrolizer 42, the reaction chamber and the furnace chamber 46b falls in the range shown in FIG. 5. In detail, the sublimation is carried out at 200 degrees to 250 degrees in centigrade at 1 torr, and the pyrolysis is carried out at 600 degrees in centigrade or higher temperature at 0.5 torr. The polymerization is carried out at −50 degrees to 50 degrees in centigrade at 0.1 torr, and the annealing is carried out at 300 degrees to 500 degrees in centigrade for 30 seconds to an hour in vacuum or inert gas atmosphere.

Figure 6:
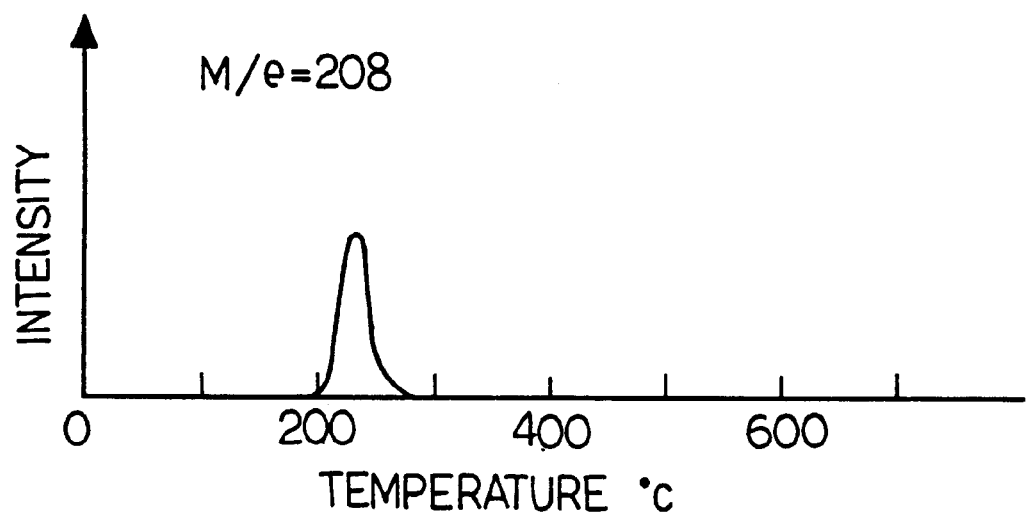
FIG. 6 is a graph showing the amount of dimer parylene released from a polymer layer in terms of temperature.
Figure 7:
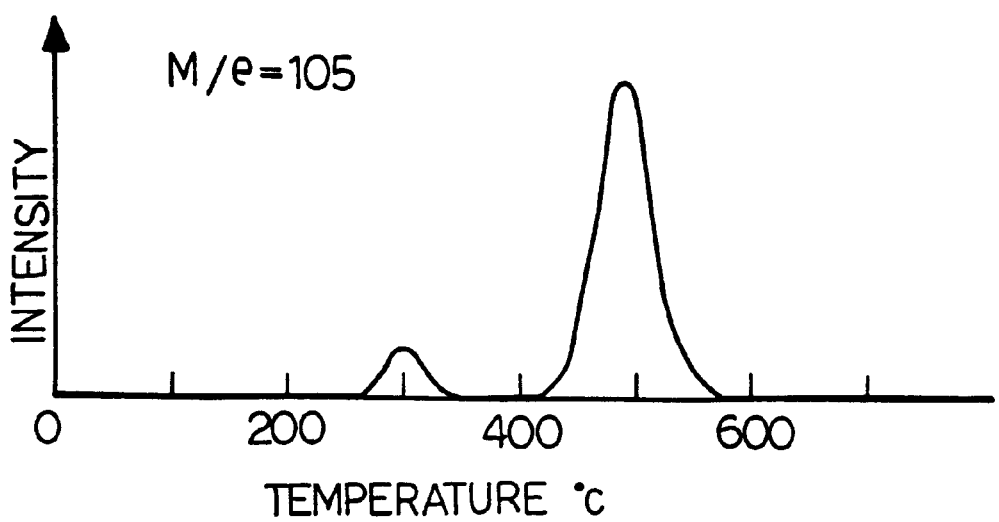
FIG. 7 is a graph showing the amount of monomer parylene released from a polymer layer in terms of temperature.

The present inventor investigated the annealing temperature as follows. The present inventor deposited the polymer of parylene-N, and heated the polymer layers from room temperature to 600 degrees in centigrade at $10^{-6}$ torr. The present inventor analyzed the outgas by using a quadrupole mass spectrometer. The output intensity of the quadrupole mass spectrometer was plotted in terms of the temperature as shown in FIGS. 6 and 7. M/e=208 represented the dimer of parylene-N, and M/e=105 represented the monomer of parylene-N. From FIGS. 6 and 7, it was understood that the dimer parylene gas was released from 200 degrees to 250 degrees in centigrade and that the monomer parylene gas was released around 300 degrees in centigrade and around 480 decrees in centigrade. The monomer parylene gas around 300 degrees in centigrade was taken into the polymer layer without polymerization, and the monomer parylene gas around 480 degrees in centigrade was produced through decomposition of the polymer parylene. For this reason, appropriate annealing temperature range was between 300 degrees in centigrade and 450 degrees in centigrade for the parylene-N, because the polymer parylene was prevented from the decomposition. However, another kind of polymer parylene had the decomposition temperature over 500 degrees in centigrade. For this reason, the present inventor determines the annealing temperature between 300 degrees and 500 degrees in centigrade.

Second Embodiment

Figure 8:
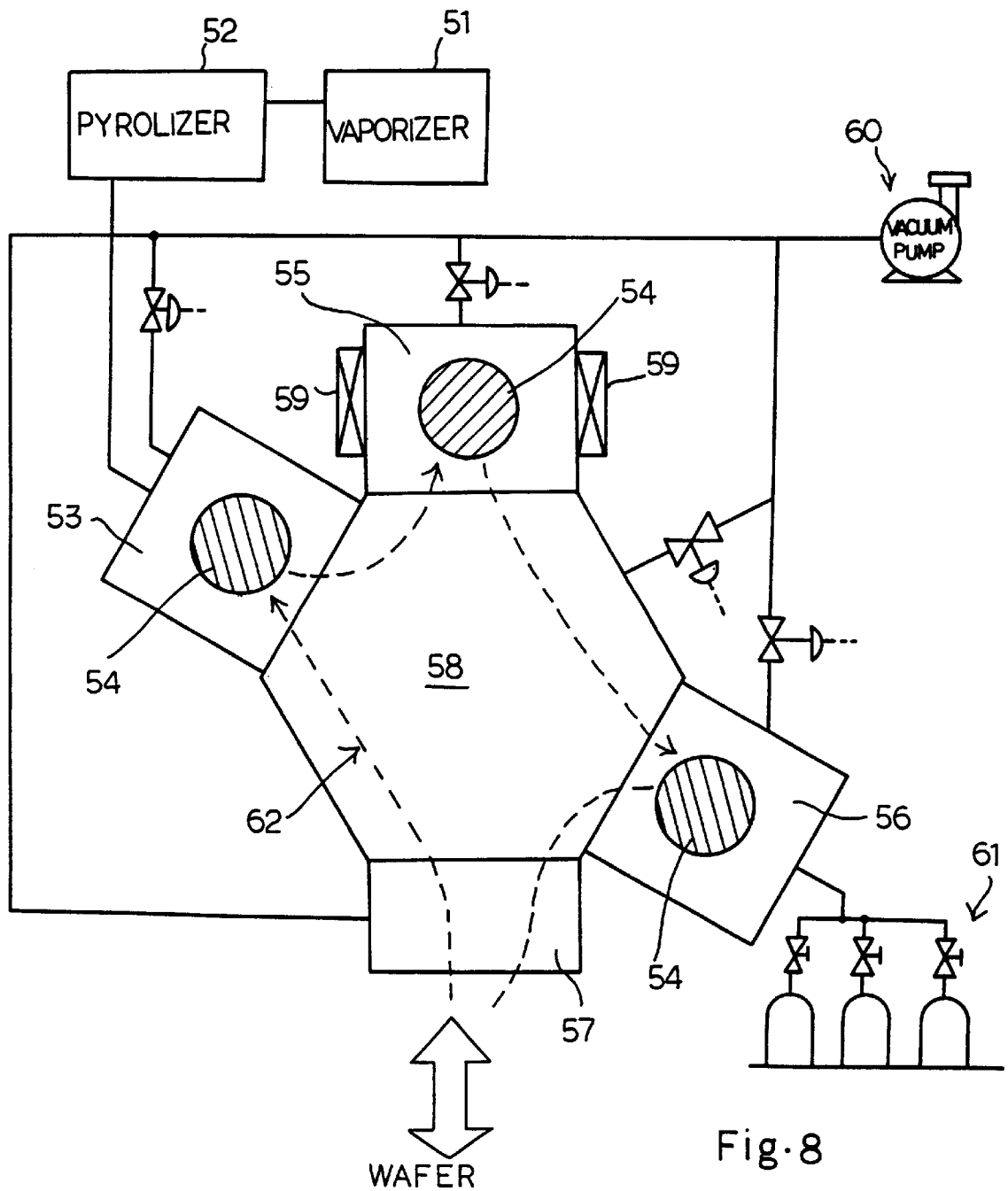
FIG. 8 is a schematic view showing another vapor phase deposition system according to the present invention.

A process implementing the second embodiment is similar to the first embodiment except a vapor phase deposition system used therein. FIG. 8 illustrates the vapor phase deposition system. The vapor phase deposition system includes a vaporizer 51, a pyrolizer 52 and a reactor chamber 53. The vaporizer 51 heats dimer of di-para-xylylene at 200 degrees in centigrade at 2 torr, then the dimer is sublimated. The dimer gas is guided to the pyrolizer 52, and is pyrolized into monomer gas at 680 degrees in centigrade. The monomer gas is supplied to the reactor 53, and is polymerized in the reactor chamber 53 where a semiconductor wafer 54 is placed. A polymer layer of parylene-N is grown on the semiconductor wafer 54.

The vapor phase deposition system further includes an annealing chamber 55, a deposition chamber 56, a load-lock chamber 57, a vacuum chamber 58, a lamp heater 59 for heating the annealing chamber 55, an evacuation sub-system 60 connected to the chambers 53, 55 to 58, a gas supply sub-system 61 connected to the deposition chamber 56 and a transfer mechanism 62. The reaction chamber 53, the annealing chamber 55, the deposition chamber 56 and the load lock chamber 57 are arranged around the vacuum chamber 58, and are connectable through the vacuum chamber 58 to one another. The transfer mechanism 62 conveys the semiconductor wafer 54 from the load lock chamber 57 through the vacuum chamber 58 to the reaction chamber 53, from the reaction chamber 53 through the vacuum chamber 58 to the annealing chamber 55, from the annealing chamber 55 through the vacuum chamber 58 to the deposition chamber 56 and from the deposition chamber 56 through the vacuum chamber 58 to the load lock chamber 57.

The semiconductor wafer 54 is loaded into to the load lock chamber 57, and is conveyed through the vacuum chamber 58 to the reaction chamber 53, and the polymer layer of parylene-N is grown in the reaction chamber 53 as described hereinbefore. After the growth of the polymer layer, the semiconductor wafer 54 is conveyed from the reaction chamber 53 through the vacuum chamber 58 to the annealing chamber 55. The annealing chamber 55 is maintained at $10^{-3}$ torr, and the semiconductor wafer 54 is heated to 380 degrees in centigrade by means of the lamp heater 59. The semiconductor wafer 54 is maintained in the high temperature vacuum for 2 minutes.

Upon completion of the annealing, the semiconductor wafer 54 is conveyed from the annealing chamber 55 through the vacuum chamber 58 to the deposition chamber 56. The gas supply sub-system 61 supplies suitable gaseous mixture into the deposition chamber 56, and silicon oxide is grown to 6000 angstroms thick on the polymer layer through a plasma-assisted chemical vapor deposition.

After the growth of the silicon oxide layer, the semiconductor wafer 54 is conveyed from the deposition chamber 56 through the vacuum chamber 58 to the load lock chamber 57, and is taken out from the load lock chamber 57 to the atmosphere.

Thus, the polymerization, the annealing and the chemical vapor deposition are continuously carried out in vacuum without exposing the semiconductor wafer 54 to the atmosphere. This residue of dimer/monomer is evacuated from the polymer layer during the annealing, and the wafer transfer through the vacuum chamber 58 prevents the polymer layer from reaction between the residual monomer and the water. As a result, the silicon oxide layer does not peel from the polymer layer, and the dielectric constant of the polymer is decreased to 2.5.

In the second embodiment, the vaporizer 51 and the pyrolizer 52 form in combination a gas supply sub-system, and the annealing chamber 55 and the lamp heater 59 as a whole constitute a gas releasing means.

Parylene-C, parylene-D, parylene-F and any kind of organic compound essentially consisting of the parylene are available for the polymer layer as similar to the first embodiment. An example of the parylene-containing organic compound is a copolymer of tetravinyl-tetramethyl-cyclotetrasiloxane and parylene-N.

As will be appreciated from the foregoing description, the residual monomer and the residual dimer are released or evacuated from the polymer layer through the annealing in the inert gas atmosphere or the vacuum, and the silicon oxide layer is strongly adhered to the polymer layer. When the inert gas atmosphere or the vacuum is dry, the residual monomer does not react with the water, and the polymer of parylene has a small dielectric constant.

Although particular embodiments of the present invention have been shown and described, it will be apparent to those skilled in the art that various changes and modifications may be made without departing from the spirit and scope of the present invention.

For example, the inert gas is never limited to the gaseous mixture between nitrogen and argon. Any kind of inert gas or gaseous mixture is available for the annealing according to the present invention. Nitrogen atmosphere is available for the annealing. Therefore, the atmosphere is created by one of the inert gas such as, for example, argon, the nitrogen gas, the gaseous mixture between the inert gas and the nitrogen and gaseous mixture between more than one kind of inert gas. Of course, the inert gas, the nitrogen or the gaseous mixture is expected to be dry.

What is claimed is:

1. A vapor phase deposition system for forming a polymer layer mainly consisting of parylene on a semiconductor structure, comprising:

a reactor having a reaction chamber where said semiconductor structure is accommodated;

an evacuating sub-system connected to said reactor for creating vacuum in said reaction chamber;

a gas supply sub-system connected to said reactor and supplying a source gas to said reaction chamber for forming a polymer layer mainly consisting of parylene over said semiconductor structure;

a gas releasing means for releasing residue of said source gas from said polymer layer mainly consisting of parylene in a high temperature vacuum, a high temperature inert gas containing atmosphere or a high temperature nitrogen gas containing atmosphere.

2. The vapor phase deposition system as set forth in claim 1, in which said gas releasing means is a furnace.

3. The vapor phase deposition system as set forth in claim 2, in which said furnace is available for a diffusion of impurity into a semiconductor layer.

4. The vapor phase deposition system as set forth in claim 1, in which said gas releasing means includes a vacuum chamber for accommodating said semiconductor structure covered with said polymer layer and a heater for heating said polymer layer.

5. The vapor phase deposition system as set forth in claim 1, further comprising a conveying means for conveying said semiconductor structure covered with said polymer layer from said reactor to said gas releasing means without exposing said semiconductor structure covered with said polymer layer to a wet atmosphere.

6. The vapor phase deposition system as set forth in claim 5, in which said conveying means includes a blowing sub-means for blowing an inert gas to said polymer layer.

7. The vapor phase deposition system as set forth in claim 5, in which said conveying means includes a vacuum chamber provided between said reactor and said gas releasing means and a conveying mechanism for conveying said semiconductor structure covered with said polymer layer from said reactor through said vacuum chamber to said gas releasing means.

8. The vapor phase deposition system as set forth in claim 7, further comprising a deposition chamber for accommodating said semiconductor structure covered with said polymer layer and a gas supply sub-system connected to said deposition chamber and supplying a source gaseous mixture for a chemical vapor deposition.

9. The vapor phase deposition system as set forth in claim 8, in which said deposition chamber is connected to said vacuum chamber, and said conveying mechanism conveys said semiconductor structure covered with said polymer from said gas releasing means through said vacuum chamber to said deposition chamber.

* * * * *